United States Patent
Chow et al.

(12)

(10) Patent No.: US 6,340,943 B1
(45) Date of Patent: Jan. 22, 2002

(54) ANALOG TO DIGITAL CONVERTER METHOD AND APPARATUS

(75) Inventors: Hugh Chow, Richmond Hill; Edward G. Callway, Toronto, both of (CA)

(73) Assignee: ATI International SRL (BB)

( * ) Notice: Subject to any disclaimer, the term of this patent is extended or adjusted under 35 U.S.C. 154(b) by 0 days.

(21) Appl. No.: 09/483,196

(22) Filed: Jan. 14, 2000

(51) Int. Cl.$^7$ ................................ H03M 1/38
(52) U.S. Cl. .................. 341/161; 341/155; 341/118
(58) Field of Search ................. 341/161, 120, 341/155, 143, 118, 156, 126, 110, 113, 162, 185

(56) References Cited

U.S. PATENT DOCUMENTS

| | | | |
|---|---|---|---|
| 4,973,974 A | * 11/1990 | Suzuki | 341/118 |
| 5,014,056 A | * 5/1991 | Monwaki | 341/161 |
| 5,274,377 A | * 12/1993 | Matsuura et al. | 341/161 |
| 5,635,937 A | * 6/1997 | Lim et al. | 341/161 |
| 5,874,912 A | * 2/1999 | Hasegawa | 341/161 |
| 5,982,313 A | * 11/1999 | Brooks et al. | 341/143 |

OTHER PUBLICATIONS

An 80–MHz, 80–mW, 8–b CMOS Folding A/D Converter with Distributed Track–and–Hold Preprocessing, IBEE Journal of Solid–State Circuits, vol. 31, No. 12, pp. 1846–1853, Dec. 1996.
High–performance 8–bit Video Data Converters, Phillips Semiconductors, Jun. 1994.

* cited by examiner

*Primary Examiner*—Brian Young
*Assistant Examiner*—John Nguyen
(74) *Attorney, Agent, or Firm*—Vedder, Price, Kaufman & Kammholz

(57) ABSTRACT

A multistage A/D converter and conversion method includes generating a partial A/D bit result of a complete A/D result at a first bit/clock rate based on the received analog input signal and generating remaining A/D bits of the complete A/D result from the partial A/D bit result, at a second and slower bit/clock rate. Accordingly, the partial A/D result output from the first stage is used as input to determine remaining A/D bits to generate a complete A/D result.

20 Claims, 4 Drawing Sheets

ANALOG TO DIGITAL CONVERTER METHOD AND APPARATUS

FIELD OF THE INVENTION

The invention relates generally to analog to digital converters (ADC's), and more particularly to multistage analog to digital converters.

BACKGROUND OF THE INVENTION

Analog to digital converters (ADC's) are used in many applications. For example, ADC's are used to convert an analog signal to a digital bit representation for analog video signal, audio signals and any other suitable analog signals. When converting analog video signals, or any other analog signals, the amount of precision (number of accurate bits), speed of operation, and cost are important factors in designing suitable analog to digital converter. Often, a 10 bit ADC may provide 8 bits of accurate information. Higher precision ADCs are often larger in die size and require changes to gains and offsets for the complex gate architecture. In addition, the more accurate the A/D converter, the longer the A/D converter takes in terms of clock cycles to generate an accurate result.

For example, one type of conventional A/D converter may use a successive approximation technique which effectively performs a binary search in a digital analog look up table and using a digital to analog converter (DAC) and comparator circuit, compares a sampled analog input signal with an output from the DAC which is a value from the lookup table. The difference between the signals is used to select a higher value or lower value from the lookup table. Such successive approximation techniques can be too slow for higher speed applications. For example, an eight bit A/D result may require 10 clock cycles to produce.

One form of successive approximation device includes tracking analog to digital converters, as known in the art. The tracking A/D converter is a type of successive approximation ADC. A tracking ADC may use a digital to analog converter in a similar manner as noted above, along with an up/down counter, controlled by the output of the comparator, to select an appropriate value from the lookup table. For example, the output of the comparator tracks the analog input signal based on a previous comparison with the analog input signal so that the input signal matches the digital to analog value in a feedback fashion. The up/down counter is sequentially incremented or decremented depending upon the direction of the difference between the analog input signal and the output of the digital to analog converter. Again, such tracking A/D converters typically require numerous clock cycles to provide a complete A/D result.

Other known conventional A/D configurations include flash analog to digital converters. Flash analog to digital converters provide parallel conversion by having simultaneous comparators comparing an input analog signal with multiple different reference levels. For example, for an 8 bit analog to digital converter, 255 comparators may be used with 255 different reference levels derived from a resistor ladder. This arrangement can provide an analog to digital result within one clock cycle. However, such flash analog to digital converters typically require an enormous number of gates. Consequently, such flash A/D converters can be susceptible to fabrication process variations, can typically consume large amounts of power and can be quite costly.

One solution has been to provide a folding analog to digital converter, such as those described, for example, in product literature entitled "High Performance 8 bit Video Data Converters", published by Philips Semiconductors, June, 1994, pp. 26–32, incorporated herein by reference. Another folding ADC arrangement is disclosed in an article entitled, "An 80 MHz, 80 mW, 8 b CMOS Folding A/D Converter With Distributed Track-and-Hold Processing," authored by Ardie G. W. Venes et al., published in the IEEE Journal of Solid-States Circuits, Vol. 31, No. 12, December 1996, pp. 1846–1853, incorporated herein by reference. Some folding ADC's may be considered multistage A/D converters since they provide a coarse A/D result and also provide a fine A/D conversion in parallel. Such an arrangement can provide advantages by being smaller than flash A/D converters and faster than conventional successive approximation A/D converters. Such known multistage A/D converters typically provide A/D processing of coarse conversions and fine conversion in parallel. However, such converters can be very difficult to implement for high resolution output.

Accordingly, a need exists for an improved A/D converter that can provide relatively fast A/D conversion at a relatively low cost.

BRIEF DESCRIPTION OF THE DRAWINGS

The invention will be more readily understood with reference to the following drawings wherein.

DETAILED DESCRIPTION OF A PREFERRED EMBODIMENT OF THE INVENTION

Briefly, a multistage A/D converter and conversion method includes generating a partial A/D bit result of a complete A/D result at a first bit/clock rate based on the received analog input signal and generating remaining A/D bits of the complete A/D result from the partial A/D bit result, at a second and slower bit/clock rate. Accordingly, the partial A/D result output from the first stage is used as input to determine remaining A/D bits to generate a complete A/D result.

In one embodiment, the remaining A/D bits of a complete A/D result include the least significant bits of the complete A/D result. If desired, the A/D conversion method and apparatus may modify a least significant bit of a partial A/D bit result in the first stage to generate a more accurate A/D conversion result, or it may maintain all partial A/D bits and add additional least significant bits.

In one embodiment, the first partial A/D bit generator may be a flash A/D converter, a folding A/D converter or any other suitable A/D converter that generates a subset of the total number of bits making up the complete A/D result at a first bit/clock rate. The second partial A/D bit generator generates A/D bits at a slower clock rate and is configured as a successive approximation A/D converter, such as a tracking A/D converter.

Figure 1:
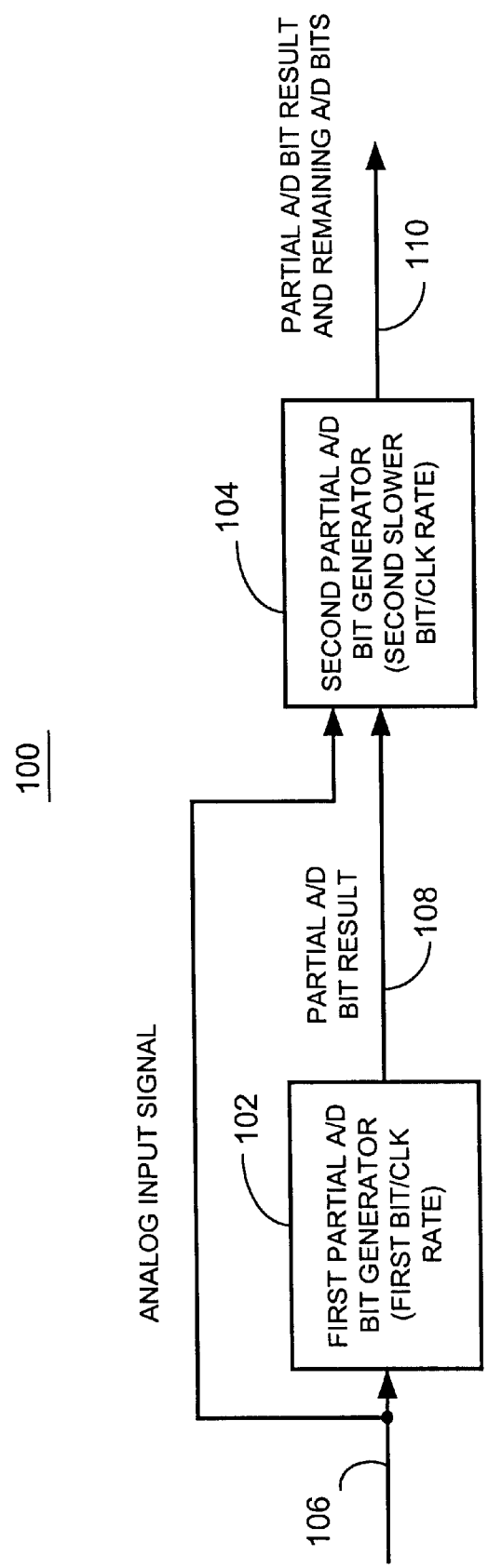
FIG. 1 is a block diagram illustrating one example of a multistage A/D converter in accordance with one embodiment of the invention.
Figure 3:
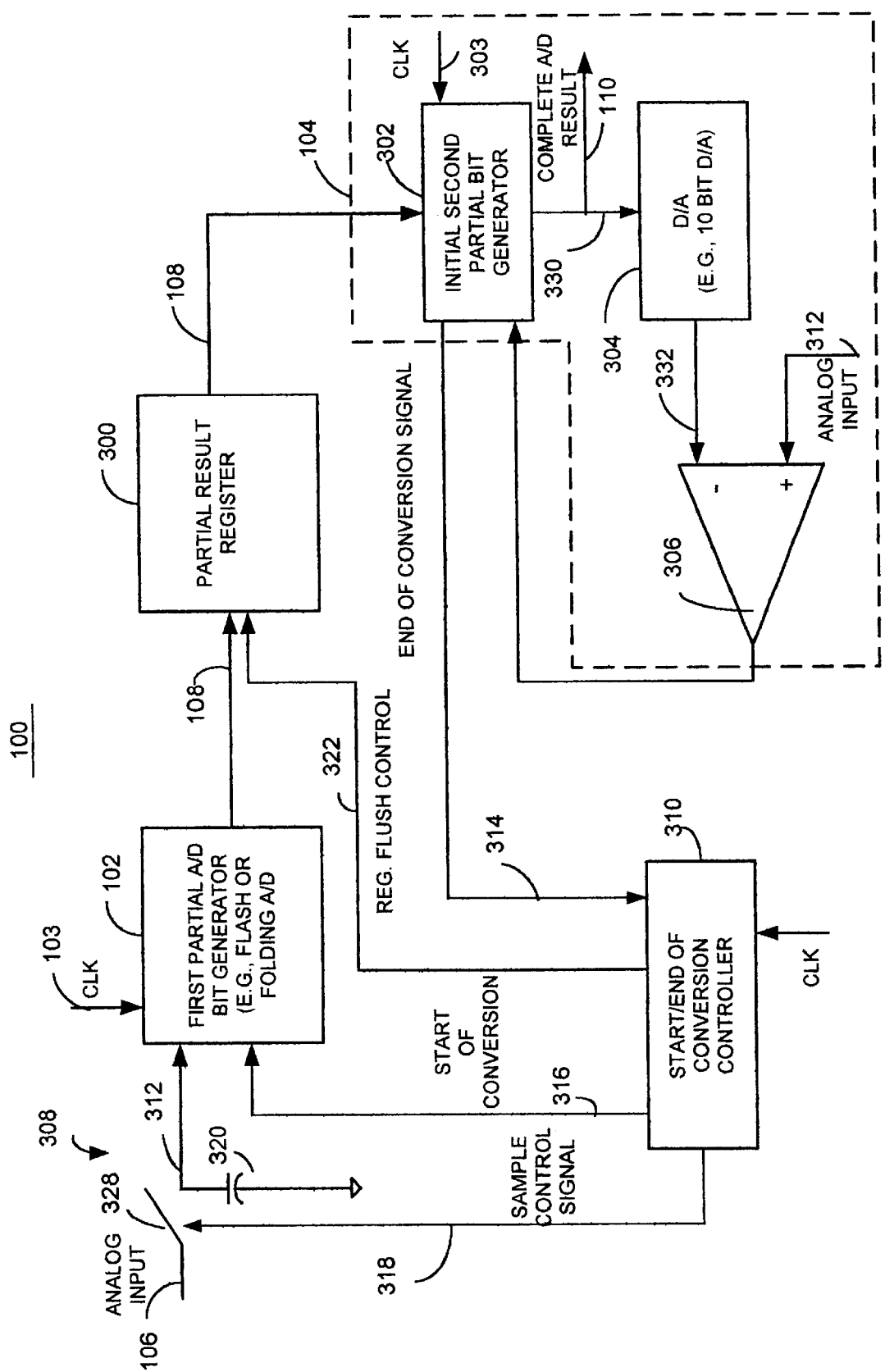
FIG. 3 is a block diagram illustrating one example of a multistage A/D converter employing a tracking A/D converter as a second partial A/D bit generator in accordance with one embodiment of the invention.

FIG. 1 illustrates one example of a multistage A/D converter 100 that includes a first partial A/D bit generator 102 and a second partial A/D bit generator 104. The first partial A/D bit generator 102 receives analog input signal 106 through a sample and hold circuit (if desired) and generates a partial A/D bit result 108 of a complete A/D result 110. This is done at a first bit/clock rate, such as at a clock speed of 35 Mhz or other suitable rate, based on a first clock 103 (FIG. 3). The first partial A/D bit generator 102 may be a flash A/D generator, a folding A/D bit per clock rate. The multistage A/D converter 100 may be made using a suitably programmed microprocessor, DSP, discrete logic, suitable combination of hardware and software, or any other desirable configuration.

The second bit A/D generator 104 is operatively coupled to receive the analog input signal 106 through a sample and hold circuit (if desired) and also is operatively responsive to the partial A/D bit result 108 from the first partial A/D bit generator 102. The second partial generator 104 is a successive approximation ADC. The second partial A/D bit generator 104 generates remaining A/D bits of the complete A/D result 110 from the partial A/D bit result 108. The second partial A/D bit generator 104 generates the remaining A/D bits at a second and slower bit per clock rate than the first partial A/D bit generator 102, for example at a multiple of the first clock (e.g., 300 Mhz second clock). The second partial A/D bit generator 104 may be a tracking A/D converter that completes the A/D conversion by determining a plurality of least significant bits (LSB's) of the complete A/D result 110. The second partial A/D bit generator 104 adjusts the least significant bits of the complete A/D result 110 so that the complete A/D result tracks the analog input signal 106.

Figure 2:
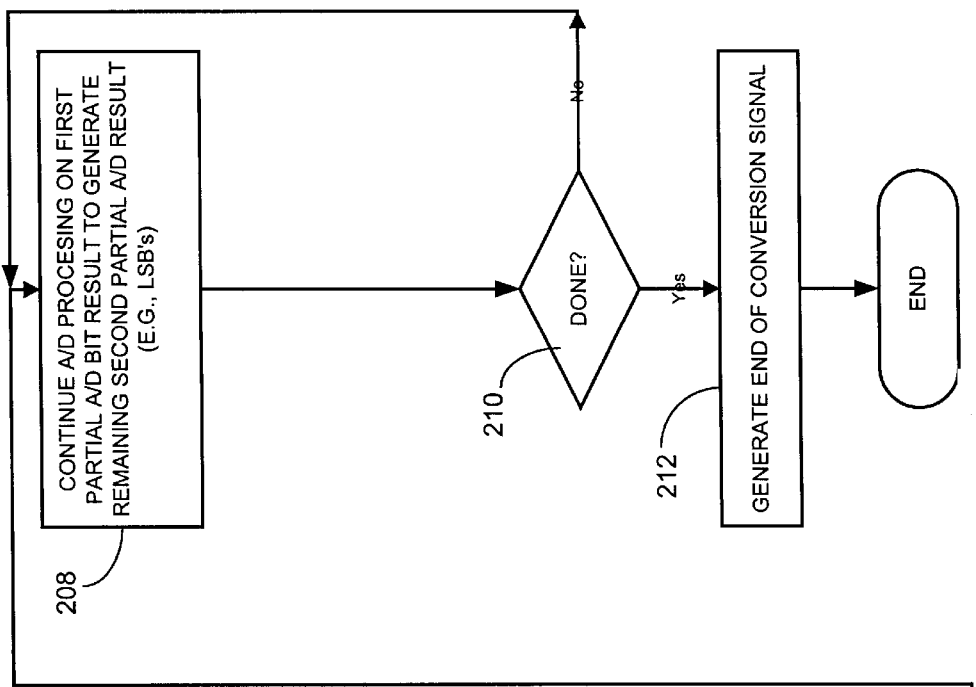
FIG. 2 is flowchart illustrating one example of the operation of the multistage A/D converter shown in FIG. 1
Figure 2:
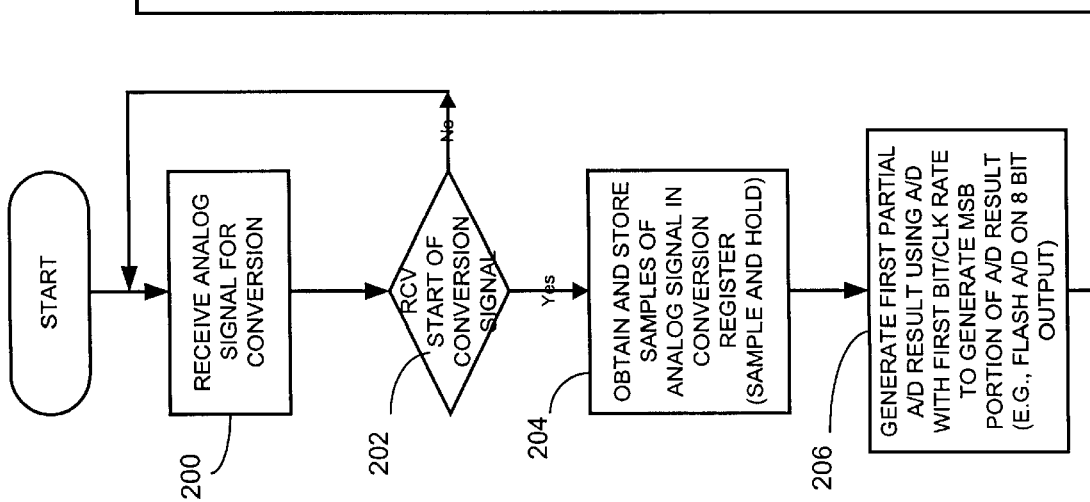

Referring to FIGS. 2 and 3, one example of the multistage A/D converter 100 and its operation is provided. The multistage A/D converter 100 may include a partial result register 300 which stores a first partial A/D bit result 108 produced from the first partial A/D bit generator 102. The partial result register 300 latches the partial A/D bit result 108 from the first partial A/D bit generator 102 before use by the second partial A/D bit generator 104.

The second partial A/D bit generator 104 includes an initial second partial bit generator 302, a digital to analog converter (DAC) 304, and comparator 306. The second partial bit generator 302 is responsive to a second clock 303 which is a multiple of the first clock 103. The first clock 103 and the second clock 303 may be generated from the same source. The multistage A/D converter 100 may also include a sample and hold circuit 308 and a start/end of conversion controller 310.

As known in the art, the sample and hold circuit 308 stores a sample of the analog input signal 106 as a sampled analog input signal 312. In this embodiment, the second partial A/D bit generator 104 is configured as a tracking A/D converter. The tracking A/D converter generates an end of conversion signal 314 to indicate when the remaining A/D bits of the complete A/D result 110 have been determined.

The start/end of conversion controller 310 generates a start of conversion signal 316 for the first partial A/D generator 102 to commence generation of the partial A/D bit result 108 after a sampled analog input signal 312 is sent. The start/end of conversion controller 310 also generates a sample control signal 318 to obtain a sample of the analog input signal 106 for storage in the storage element 320, such as a capacitor. The start/end of conversion controller 310 also generates a register flush control signal 322 for the partial result register 300 to flush the partial result register 300 at the end of a conversion to reset the partial result register 300 to receive the next partial A/D bit result 108.

The multistage converter 100 receives the analog signal for conversion as shown in block 200 (FIG. 2). The start/end of conversion controller 310 generates the sample control signal 318 to control switch 328 to control a sample and hold using storage element 320 to obtain a sample of the input signal 106. As shown in block 202, the start/end of conversion controller 310 generates the start of conversion signal 316 to initialize the first partial A/D) bit generator 102. The first partial A/D bit generator 102 determines if it has received the start of the conversion signal, as shown in block 202. If the start of conversion signal 316 has been received, the process includes obtaining and storing samples of the stored analog signal 312 in an on board conversion register (not shown), by the first partial A/D bit generator, as shown in block 204. As shown in block 206, the process includes generating the first partial A/D bit result 108 at the first bit per clock rate to generate the most significant bit (MSB) portion of a complete A/D result 110. The most significant bits (MSB's and any dummy LSB's) (see FIG. 4), e.g., the partial A/D bit generator 102. The process includes storing the partial A/D bit result 108 in the partial result register 300. The partial result register serves as a type of latching mechanism to temporarily store the partial A/D bit result 108, namely the most significant bits of the complete result, for use by the second partial A/D bit generator 104.

Figure 4:
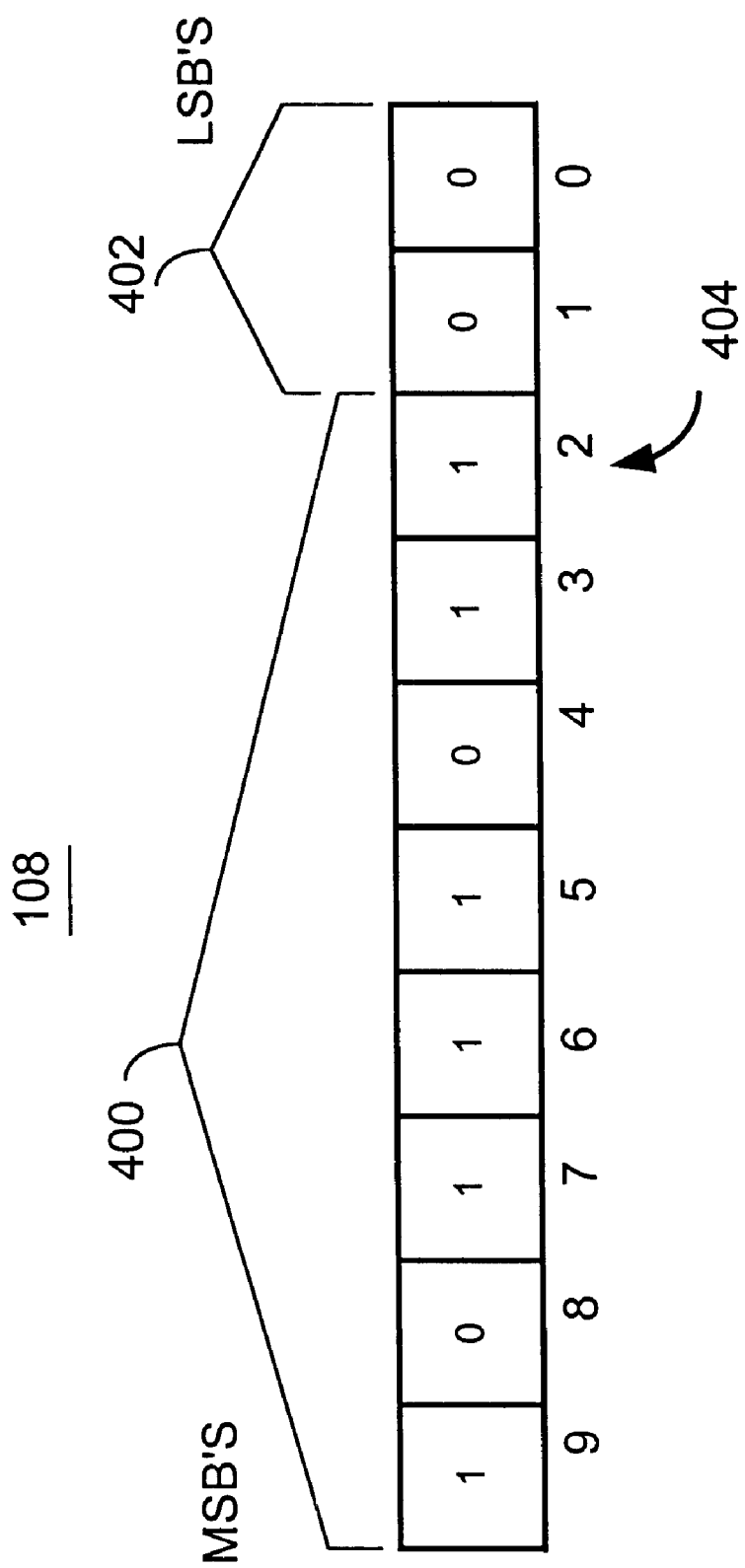
FIG. 4 is a schematic representation of the partial A/D bit result generated by the multistage A/D converter in accordance with one embodiment of the invention.

Referring also to FIG. 4, one example of a partial A/D bit result 108 is shown wherein the most significant bits 400 are generated by the first partial bit generator 102 and the least significant bits 402 are filled with zeros for a 10-bit A/D result. The least significant bits 402 represent remaining A/D bits of the complete A/D result 108 that are subsequently determined by the second partial A/D bit generator that operates at a second and slower bit per clock rate than the first partial A/D bit generator. The initial second partial bit generator 302 either sets the remaining bits to an initial level based on a previously completed A/D result, or passes the entire 10-bit result as an initial current complete A/D result 330 to the 10-bit digital to analog converter 304.

The 10-bit digital to analog converter 304 converts the current complete A/D result 330 which in this example has the least significant bits 402 set to zero, to an analog input voltage 332 for the comparator 306. The sampled analog input 312 is then compared with the analog output 332 from the digital to analog converter 304 resulting in a difference signal 334 that is received by the initial second partial bit generator 302. The initial second partial bit generator 302 then increments or decrements the 10 -bit value by populating the least significant bits 402 based on whether the difference signal 334 is positive or negative. For example, if the difference is positive, meaning that the current complete A/D result is lower relative to the analog input, the initial second partial bit generator 302 matches the analog input signal 312. This may be done in a conventional manner as known in tracking A/D converters. Once the analog levels match, the current complete A/D result 330 is sent as the complete A/D result 110. Accordingly, as indicated in block 210 of FIG. 2, the process determines whether or not a complete A/D result 110 has been generated. If the analog output 332 and sampled analog input 312 match, the initial second partial bit generator 302 generates the end of conversion signal 314 shown in block 212 to indicate an end of the conversion.

Accordingly, the first partial A/D bit generator 102 effectively maps an 8-bit output to a ten bit value with the eight most significant bits serving as an eight-bit output, and fills the two least significant bits to zero or some other predetermined value to generate a coarse partial A/D result 108.

The second partial A/D bit generator 104 fine tunes the partial A/D bit result 108 by determining the two remaining least significant bits.

If desired, the second partial A/D bit generator 104 may complete the A/D conversion by also modifying a least significant bit 404 of the most significant bits 400 generated as the partial A/D bit result 108, instead of setting the last bit to an initial value. For example, referring to FIG. 4, the second partial A/D bit generator 104 may also modify bit 404 (bit 2) or other least significant bits in addition to LSB's 402 (bits 0 and 1) since the least significant bits of the most significant bit group 400 may be inaccurate.

The digital to analog converter 304 generates the analog output signal 332 which represents a digital current complete A/D result 330. The initial second partial bit generator 302 serves as control logic which produces the current complete A/D result 330 for the digital to analog converter 304. The comparator 306 compares the analog output 332 representing the current complete A/D result with the analog input signal 312 to output the control signal 334 to the control logic based on the comparison to facilitate generating the final complete A/D result 110.

In an alternative embodiment, the tracking A/D converter may include a programmable up/down counter as part of the initial partial bit generator 302, to adjust the least significant bits 402 of the complete A/D result 110 as a tracking A/D, so that the complete A/D result 110 tracks the analog input signal 312. It will be recognized that any other suitable logic configuration may also be used.

The first partial A/D bit generator 102 may be an 8-bit flash A/D converter, as known in the art, or any other suitable size. Alternatively, the first partial A/D bit generator 102 may be a folding A/D converter.

Accordingly, the disclosed multistage A/D converter can provide a complete A/D result in $2^{m-n}$ clocks, where m is the size of the completed A/D result (e.g., 10 bits) and n is the actual bit accuracy of the first partial bit generator (e.g., 8 bits of a 10 bit result). For example, where the size of the completed A/D result is ten bits, and bit accuracy is eight bits, the first partial A/D bit generator may be a flash A/D converter resulting in an eight bit partial A/D bit result 108 in one clock cycle. The remaining two bits may be generated using, for example, the tracking ADC which may take an additional four clock cycles since two bits are being determined. If desired, eight more cycles (or any suitable number) may be used to provide two additional bits for error correction purposes. Also, the disclosed multistage ADC and method uses bits generated from a first stage as input for the second stage to efficiently generate a complete A/D result.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A multistage A/D converter comprising:
   a first partial A/D bit generator operatively coupled to receive an analog input signal to be converted, and operative to generate a partial A/D bit result of a complete A/D result, at a first bit/clock rate; and
   a second partial A/D bit generator, operatively coupled to the analog input signal and operatively responsive to the partial A/D bit result from the first partial A/D bit generator, that generates remaining A/D bits of the complete A/D result, from the partial A/D bit result at a second and slower bit/clock rate.

2. The A/D converter of claim 1 wherein the second partial A/D bit generator completes the A/D conversion by determining a plurality of least significant bits (LSB's) of the complete A/D result.

3. The A/D converter of claim 2 wherein the second partial A/D bit generator completes the A/D conversion by also modifying at least one LSB of the partial A/D bit result to generate a more accurate A/D conversion result.

4. The A/D converter of claim 2 wherein the second partial A/D bit generator includes a tracking A/D converter that operatively adjusts the LSB's of the complete A/D result so that the complete A/D result tracks the analog input signal.

5. The A/D converter of claim 4 wherein the tracking A/D converter includes:
   a digital to analog converter operatively coupled to generate an analog signal representing a current complete A/D result;
   control logic operatively coupled to produce the current complete A/D result for the digital to analog converter; and
   a comparator, operatively coupled to compare the analog signal representing the current complete A/D result with the analog input signal, and to output a control signal to the control logic based on the comparison to facilitate generating a final complete A/D result.

6. The A/D converter of claim 1 wherein the second partial generator is a successive approximation A/D converter.

7. The A/D converter of claim 4 wherein the tracking A/D converter includes a programmable up/down counter to adjust the LSB's of the complete A/D result so that the complete A/D result tracks the analog input signal.

8. The A/D converter of claim 1 wherein the first partial generator includes a flash A/D converter.

9. The A/D converter of claim 1 wherein the first partial generator includes is a folding A/D converter.

10. A multistage A/D converter comprising:
    a first partial A/D bit generator that generates a partial A/D bit result of a complete A/D result, in a single clock cycle based on a first bit/clock rate; and
    a second partial A/D bit generator operatively responsive to the partial A/D bit result from the first partial A/D bit generator that generates remaining A/D bits of the complete A/D result from the partial A/D bit result at a second and slower bit/clock rate, wherein the second-partial A/D bit generator completes the A/D conversion by determining a plurality of least significant bits (LSB's) of the complete A/D result and wherein the second partial A/D bit generator includes a tracking A/D converter that operatively adjusts the LSB's of the complete A/D result so that the complete A/D result tracks the analog input signal.

11. The A/D converter of claim 10 wherein the second partial A/D bit generator completes the A/D conversion by also modifying at least one LSB of the partial A/D bit result to generate a more accurate A/D conversion result.

12. The A/D converter of claim 10 wherein the tracking A/D converter includes:
    a digital to analog converter operatively coupled to generate an analog signal representing a current complete A/D result;
    control logic operatively coupled to produce the current complete A/D result for the digital to analog converter; and a comparator, operatively coupled to compare the analog signal representing the current complete A/D result with the analog input signal, and to output a control signal to the control logic based on the comparison to facilitate generating a final complete A/D result.

13. The A/D converter of claim 10 wherein the second partial generator is a successive approximation A/D converter.

14. The A/D converter of claim 10 wherein the tracking A/D converter includes a programmable up/down counter to adjust the LSB's of the complete A/D result so that the complete A/D result tracks the analog input signal.

15. The A/D converter of claim 1 wherein the first partial generator includes is a folding A/D converter.

16. An A/D conversion method comprising the steps of:
   generating a partial A/D bit result of a complete A/D result from a first partial A/D bit generator, at a first bit/clock rate based on a received analog input signal; and
   generating remaining A/D bits of the complete A/D result from a second partial A/D bit generator, from a combination of the input signal and the partial A/D bit result at a second and slower bit/clock rate.

17. The method of claim 16 wherein the step of generating remaining A/D bits includes the step of completing the A/D conversion by determining a plurality of least significant bits (LSB's) of the complete A/D result.

18. The method of claim 16 wherein the step of generating remaining A/D bits includes the step of completing the A/D conversion by also modifying at least one LSB of the partial A/D bit result to generate a more accurate A/D conversion result.

19. The method of claim 17 wherein the step of generating remaining A/D bits includes adjusting the LSB's of the complete A/D result so that the complete A/D result tracks the analog input signal.

20. A multistage analog to digital converter, comprising:
   a first partial bit generator, operatively coupled to receive an analog input signal to be converted, generating a first portion of a complete analog to digital result, the first partial bit generator operating at a first bit/clock rate; and
   a second partial bit generator, operatively coupled to the analog input signal and the first partial bit generator, the second partial bit generator generating a second portion of the complete analog to digital result, in response to the first portion of the complete analog to digital result at a second bit/clock rate, the second bit/clock rate being slower than the first bit/clock rate.

* * * * *